United States Patent [19]

Uratsuji et al.

[11] Patent Number: 5,037,321
[45] Date of Patent: Aug. 6, 1991

[54] CONNECTOR FOR ELECTRIC PART

[75] Inventors: Kazumi Uratsuji; Noriyuki Matsuoka, both of Tokyo, Japan

[73] Assignee: Yamaichi Electric Mfg. Co., Ltd., Tokyo, Japan

[21] Appl. No.: 530,168

[22] Filed: May 29, 1990

[30] Foreign Application Priority Data

May 29, 1989 [JP] Japan ................... 1-137032

[51] Int. Cl.⁵ ............................. H01R 4/50
[52] U.S. Cl. .................... 439/342; 439/259
[58] Field of Search ............... 439/259, 260, 261, 262, 439/263, 265, 266, 267, 268, 264, 330, 331, 342

[56] References Cited

U.S. PATENT DOCUMENTS 4,402,563  9/1983  Sinclair .................... 439/264
4,519,660  5/1985  Ichimura et al. ........... 439/268 X
4,836,798  6/1989  Carter ..................... 439/268

FOREIGN PATENT DOCUMENTS 57-175388  11/1982  Japan.
60-52547   11/1985  Japan.

OTHER PUBLICATIONS

IBM Technical Bulletin, vol. 22, No. 5, 10-1979, (p. 1936).

Primary Examiner—Neil Abrams
Assistant Examiner—Khiem Nguyen
Attorney, Agent, or Firm—Wenderoth, Lind & Ponack

[57] ABSTRACT

A connector for an electric part includes a connector body for the connection with the electric part, and a moving plate movably mounted on the connector body and able to move in the horizontal direction along the upper surface of the connector body, the connector body, when moved in one direction, being brought into contact with the electric part and brought out of contact when moved in the other direction. The connector comprises fist and second operating levers operated to move the moving plate in the horizontal direction, one end of the first operating lever being pivotably supported on a side surface of one end of the connector body through a supporting shaft and the second operating lever being likewise pivotably supported on a side surface of the other end of the connector body through a supporting shaft. One end of the first operating lever is supported on a side surface of one end of the moving plate through a transmission shaft and one end of the second operating lever is likewise supported on a side surface of the other end of the moving plate through a transmission shaft. The transmission shafts is disposed such that when the first and second operating levers are pivoted in the opposite direction about the supporting shafts, a horizontal force directing in the same direction is applied to both ends of the moving plate.

4 Claims, 5 Drawing Sheets

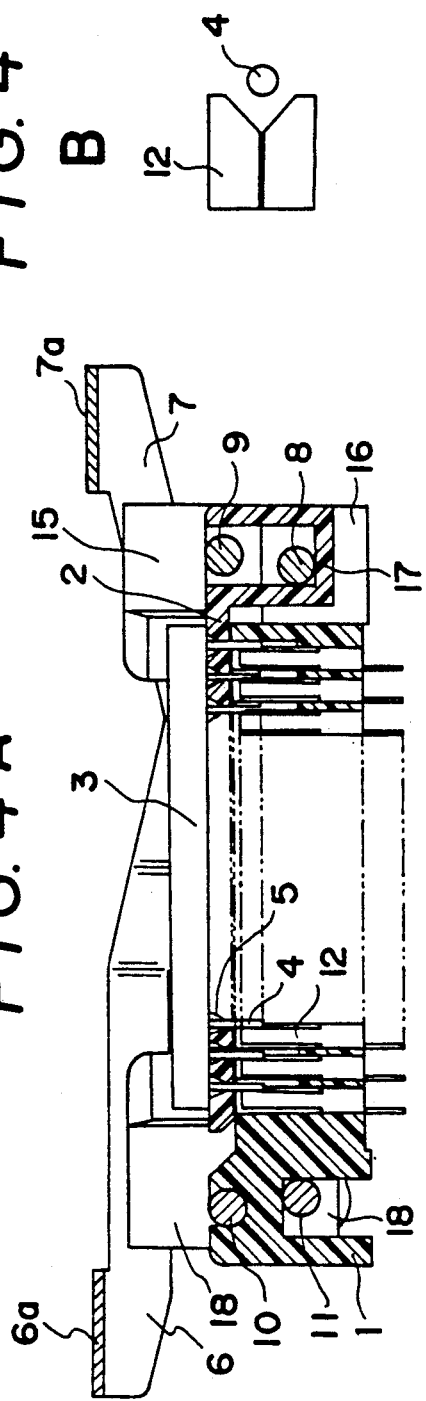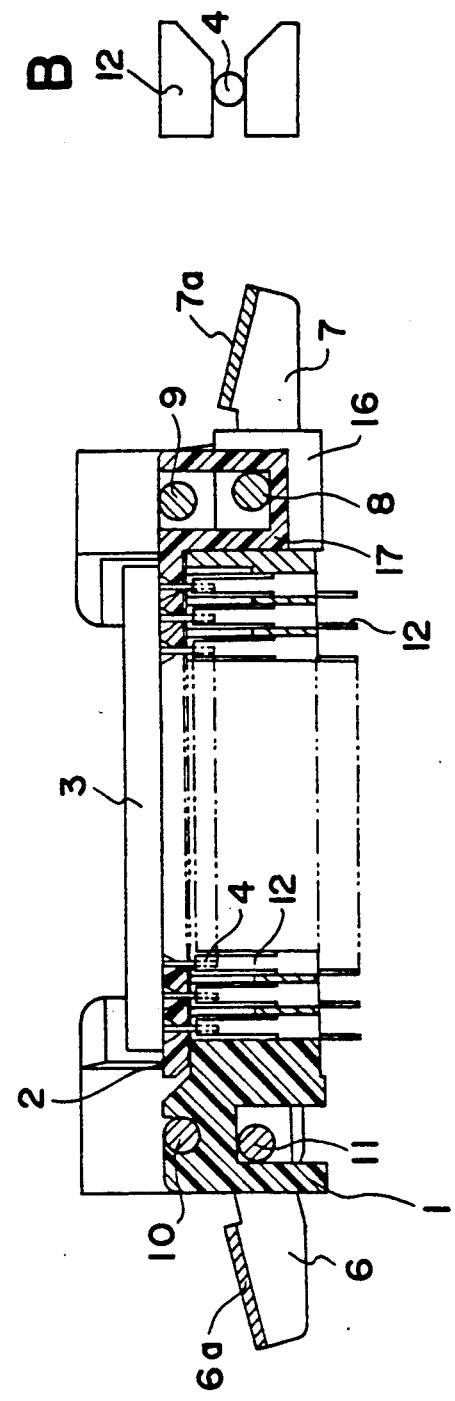

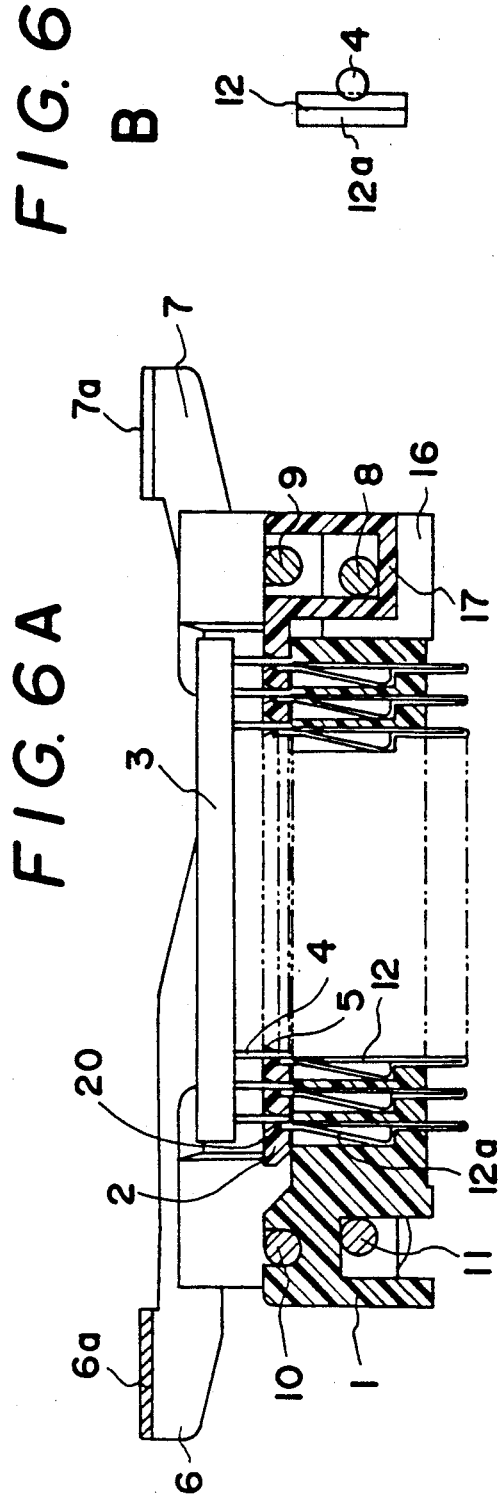
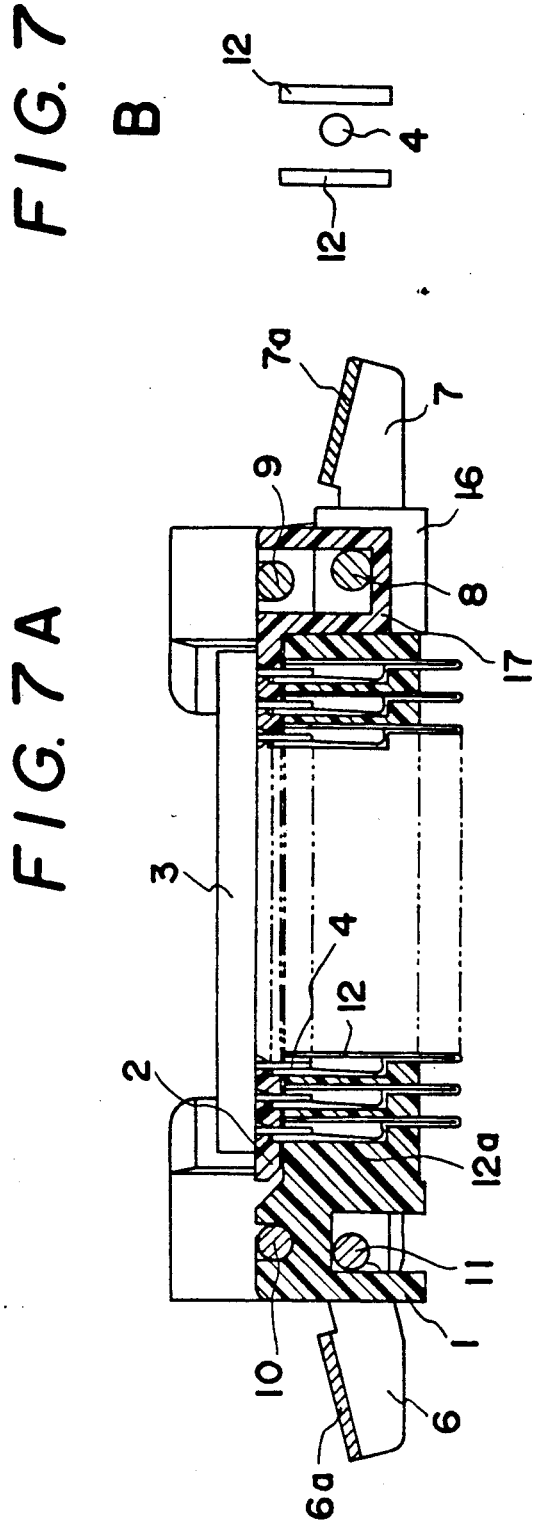

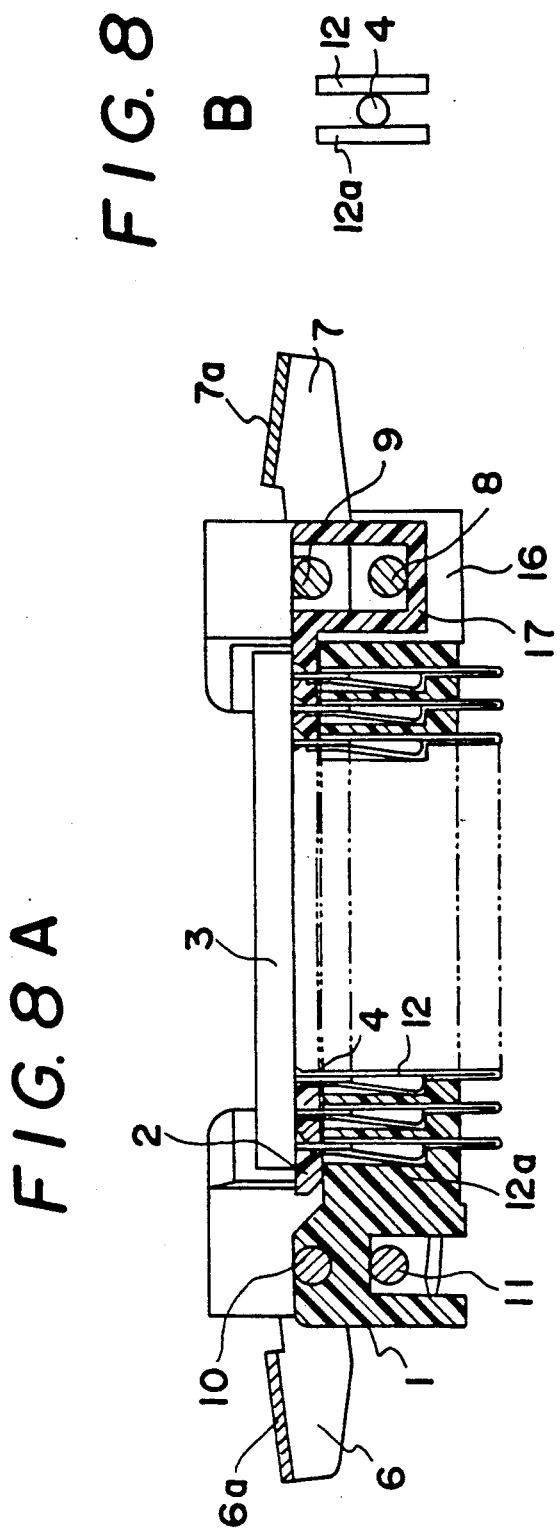

CONNECTOR FOR ELECTRIC PART

BACKGROUND OF THE INVENTION

1. Field of the Invention

This invention relates to a connector for an electric part having means for moving a moving plate in the horizontal direction along the upper surface of a connector body in order to achieve a contacted state and a released state, and particularly to a moving mechanism for moving the moving plate.

2. Brief Description of the Prior Art

Japanese Utility Model Early Laid-open Publication No. Sho 57-175388 discloses a connector for an electric part comprising a connector body, a moving plate, pins projecting in vertical relation from both side surfaces of the moving plate and the connector body and adapted as means for moving the moving plate in the horizontal direction along the upper surface of the connector body in order to achieve a contacted state and a released state, a U-shaped groove formed in an end portion of an operating lever and adapted to removably receive the pins therein, the operating lever being upright astride the connector body while removably receiving the pins in the U-shaped groove, and the pins disposed on the side of the movable plate and snugly fitted in the U-shaped groove having a lateral force exerted thereon when the lever is pivoted rightward or leftward from its position upright astride the connector body, thereby to achieve the contacted state and the released state.

Another connector of this type is disclosed in Japanese Patent Publication No. Sho 60-52547, in which a crank lever is pivotably mounted on one end of the overlapped portion between a moving plate and a connector body, and an eccentric shaft portion is disposed on a crank shaft portion, the crank lever being pivoted to cause the eccentric shaft portion to act on the moving plate, thereby to achieve the contacted state and the released state.

In the former connector, however, the operating lever upright astride the connector body is an obstacle for an electric part such as IC when the electric part is attached to and removed from the connector. Therefore, it not only is inconvenient in that the lever must be mounted on and removed from the connector body every time the moving plate is operated to move or every time the IC is attached to and removed from the connector body, but also requires that the lever be kept.

Furthermore, as this conventional connector is designed such that the operating lever is pivoted rightwards or leftwards in order to move the moving plate, there cannot be employed a method for achieving the pivotal operation of the operating lever by simply vertically moving a manipulator of a robot. Therefore, this connector is not suitable for automating the moving operation of the moving plate.

On the other hand, in the crank lever system of the latter connector, there are such problems that the crank shaft portion disposed between the connector body and the moving plate becomes twisted to make it impossible to transmit the motion caused by the eccentric shaft portion and, as a result, the distance of movement of the moving plate becomes irregular and an unsatisfactory contacting relation results.

Furthermore, it has the following problems. In order to obtain a sufficient distance of movement of the moving plate, if an amount of bend is provided to make it possible to obtain a large eccentric movement of the eccentric shaft portion, the above-mentioned twist in increased. On the other hand, if the amount of bend is reduced, the pivoting angle of the lever must be increased and if the pivoting angle is increased, the lever is brought to be in its upright state. As a result, like the preceding prior art, such a lever cannot be operated by vertical motion using a robot, etc. and if an obstacle is present above the connector, operation becomes difficult.

Also, in any of the above-described conventional contacts, the construction is such that a lateral force is exerted to one place on the moving plate, i.e., either one end or a central portion of the moving plate. Accordingly, there is a fear as that one-sided force is exerted on the moving plate and a smooth and stable horizontal movement is unobtainable and the operation becomes heavy.

SUMMARY OF THE INVENTION

It is therefore an object of the present invention to provide a connector for an electric part which is capable of stably moving a moving plate in the horizontal direction with a reduced force and without causing the above-mentioned problems, so that a proper contacted state and released state can be obtained.

In order to achieve the above object, there is essentially provided a connector for an electric part including a connector body for connection with the electric part, and a moving plate movably mounted on the connector body and able to move in the horizontal direction along the upper surface of the connector body, the connector body, when moved in one direction, being brought into contact with the electric part and brought out of contact when moved in the other direction, the connector comprising first and second operating levers operated to move the moving plate in the horizontal direction, one end of the first operating lever being pivotably supported on a side surface of one end of the connector body through a supporting shaft and the second operating lever being likewise pivotably supported on a side surface of the other end of the connector body through a supporting shaft, one end of the first operating lever being supported on a side surface of one end of the moving plate through a transmission shaft and one end of the second operating lever being likewise supported on a side surface of the other end of the moving plate through a transmission shaft, the transmission shafts being disposed such that when the first and second operating levers are pivoted in opposite directions to each other about the supporting shafts, a horizontal force directed in the same direction is applied to both ends of the moving plate. A free end of the first lever may be disposed to an external side of the pivotal supporting portion of the second operating lever and a free end of the second operating lever may be likewise disposed to an external side of the pivotal supporting portion of the first operating lever.

According to the present invention, when the first and second operating levers are simultaneously pushed downward, a lateral force directed in the same direction is exerted on both end portions of the moving plate through the pair of transmission shafts, and the moving plate is stably and smoothly moved in the horizontal direction. As a result, a proper contacted state (or released state) can be obtained by the horizontal movement of the moving plate. On the contrary, in order to release the contacted state (or to achieve the contacted state), the first and second operating levers are likewise simultaneously pushed upwards. As a result, a lateral force directed in the same direction is exerted on both end portions of the moving plate by the pair of transmission shafts and the moving plate is stably and smoothly moved in the horizontal direction. By exerting the lateral force on the both end portions of the moving plate, the operation force can be reduced.

The above and other objects and characteristic features and advantages of the present invention will become more apparent to those skilled in the art as the disclosure is made in the following description of preferred embodiments of the invention, as illustrated in the accompanying drawings.

BRIEF DESCRIPTION OF THE DRAWINGS

FIG. 3 is a view in which the levers are already pushed downwards;

FIG. 4A is a sectional view of the connector corresponding to FIG. 2;

FIG. 4B is a plan view showing the relation between a contact and a lead when the connector is in the state of FIG. 4A;

FIG. 5A is a sectional view of the connector corresponding to FIG. 3;

FIG. 5B is a plan view showing the relation between the contact and the lead when the connector is in the state of FIG. 5A;

FIGS. 6 through 8 are several views showing another embodiment of the present invention;

FIG. 6A is a sectional view of a connector in which an operating lever is already pulled upwards;

FIG. 6B is a plan view showing the relation between a contact and a lead when the connector is in the state of FIG. 6A;

FIG. 7A is a sectional view of the connector in which the operating lever is already pushed downwards;

FIG. 7B is a plan view showing the relation between the contact and the lead when the connector is in the state of FIG. 7A;

FIG. 8A is a sectional view of the connector which is in a contacted state; and

FIG. 8B is a plan view showing the relation between the contact and the lead when the connector is in the state of FIG. 8A.

DETAILED DESCRIPTION OF THE PREFERRED EMBODIMENTS

Figure 1:
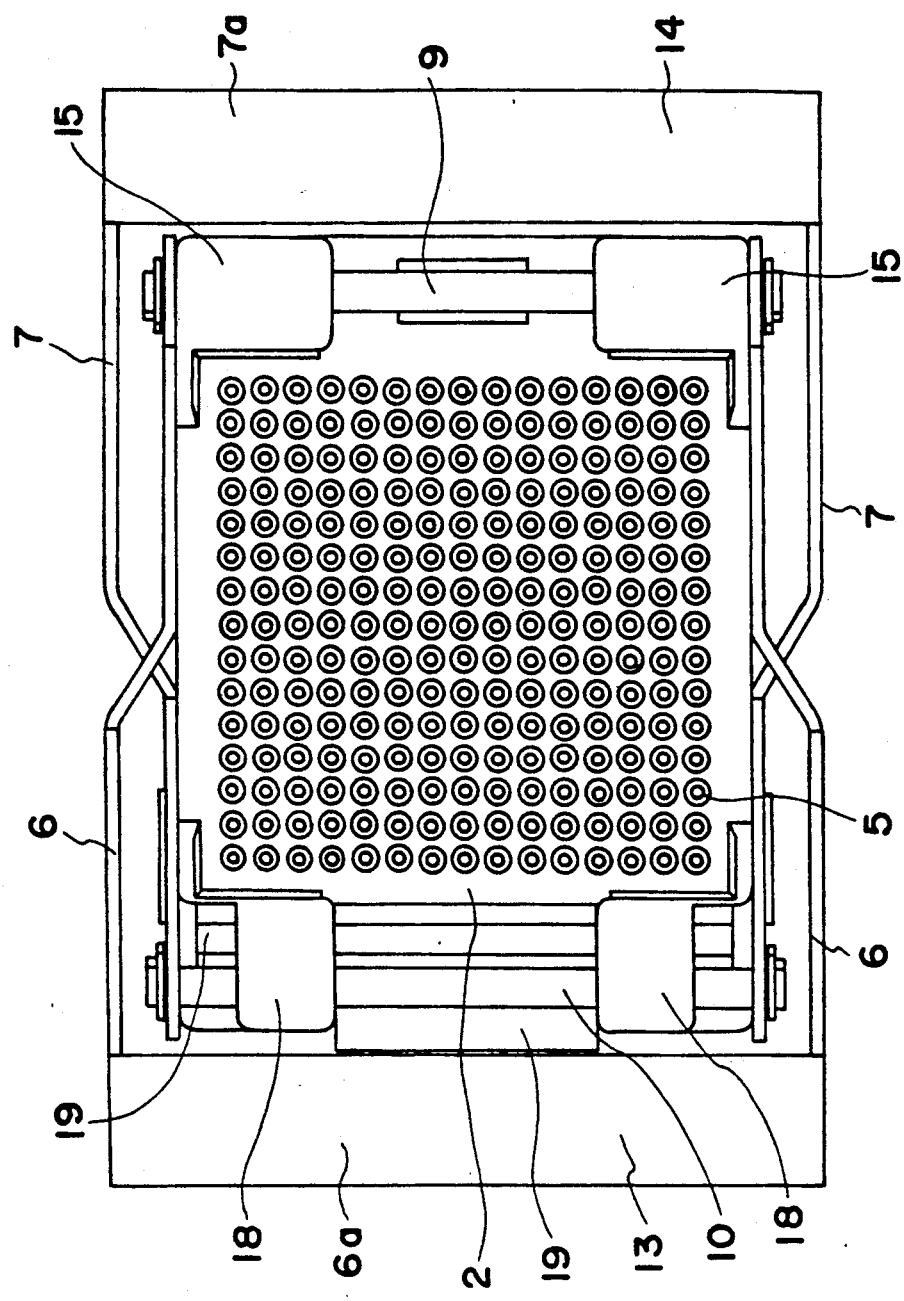
FIG. 1 is a plan view of a connector according to one embodiment of the present invention.

The preferred embodiments of the present invention will now be described with reference to FIGS. 1 through 8.

The numeral 1 denotes a connector body for an electric part which is to be attached to a wiring board, etc. The connector body 1 has a moving plate 2 which is moved along the upper surface thereof.

When the moving plate 2 is moved in one horizontal direction along the upper surface of the connector body 1, a contacted state is achieved with respect to an electric part 3 such as IC, etc. placed on the connector body 1 through the moving plate 2, and when the moving plate 2 is moved in the other horizontal direction, the contacted state with respect to the electric part is released.

The illustrated connector is constructed as follows. The moving plate 2 is superposed on the upper surface of the square connector body 1 formed of an insulator material. The moving plate 2 is provided with a number of holes 5 arranged in a lattice shape consisting of vertical rows and lateral rows and allowing terminals of the electric part 3 to penetrate therethrough. While placing the electric part 3 on the upper surface of the moving plate 2, the terminals 4 are thrust into the holes 5 and the leading ends of the terminals 4 are received in a contact accommodating chamber of the connector body 1 which is formed in such a manner as to correspond to the holes 5. Then, as is shown in FIGS. 4 and 5, by moving the moving plate 2 in one horizontal direction, the terminals 4 held in the holes 5 are brought to a contacted position (FIG. 5) from a released position (FIG. 4) both with respect to normally closed contacts 12, and by moving the moving plate 2 in the other horizontal direction, the terminals 4 are brought to the released position (FIG. 4) from the contacted position (FIG. 5).

As is shown in FIGS. 6 through 8, one contact element 12a of end contact 12 for pinching the terminal 4 of the electric part is engaged with the moving plate 2 in its closed state, and that when the moving plate 2 is moved in the one horizontal direction, the contact element 12a is displaced against its elasticity by the end of the corresponding terminal 4 to open the contact and after release of the force on the plate 2 the restoring force of the contact element 12a is exerted on the moving plate 2 to move it in the other horizontal direction, and upon the horizontal movement of the moving plate 2 in the other direction, the contact 12 is closed and the terminal 4, which has dropped between the contact parts 12a and 12b, is pinched between contact parts 12a and 12b.

As for a means for moving the moving plate 2 in the horizontal direction, a first operating lever 6 and a second operating lever 7 are provided.

A lower portion of one end of the first operating lever 6 is pivotably supported on a side surface of one end of the connector body 1 by a supporting shaft 8 and an upper portion of the operating lever 6 is supported on a side surface of one end of the moving plate 2 by a transmission shaft 9. On the other hand, an upper portion of one end of the second operating lever 7 is pivotably supported on a side surface of the other end of the connector body 1 by a supporting shaft 10 and a lower portion of one end of the operating lever 7 is supported on a side surface of the other end of the moving plate 2.

The transmission shaft 9 is disposed such that when the first operating lever 6 is pivoted counterclockwise about the supporting shaft 8, a lateral force directed toward support shaft 10 is exerted on the one end of the moving plate 2. On the other hand, the transmission shaft 11 is disposed such that when the second operating lever 7 is pivoted clockwise about the supporting shaft 10, a lateral force in the same direction as the lateral force of transmission shaft 9 is exerted on the other end of the moving plate 2.

That is, the first operating lever 6 and the second operating lever 7 are supported on the connector body 1 and the moving plate 2 such that the vertical arrangement of the supporting shaft 8 and transmission shaft 9 on the one end of the operating lever 6 and the vertical arrangement of the supporting shaft 10 and transmission shaft 11 on the second operating lever 7 are reversed with respect to each other.

This embodiment will be described in more detail with reference to the drawings. A pair of bearings 15 also acting as means for regulating corners of the electric part 3 are integrally provided on right and left corner portions of the one end of the moving plate 2, and both ends of the transmission shaft 9 are carried in the bearings 15. At the same time, a moving plate portion between the pair of bearings 15 extends downwardly between a pair of bearings 16 formed on the right and left corner portions of the one end of the connector body 1 to form a stopper 17, so that when the moving plate 2 is moved in the horizontal direction from the released position to the contacted position, the stopper 17 is brought into abutment engagement with one end face of a socket board to remain in the contacted position as shown in FIG. 5A. The two ends of the supporting shaft 8 are carried in the bearings 16, the stopper 17 is formed with a hollow interior in order not to interfere with the supporting shaft 8, and the supporting shaft 8 extends therethrough. Likewise, a pair of bearings 18 also acting as means for regulating the corners of the electric part 3 are integrally provided on right and left corner portions of the other end of the moving plate 2 and the other end of the connector body 1 is interposed between the inner sides of the bearings 18 and extends on the outer sides of the bearings 18. The interposed portion and outer side portions form bearings 19 and a central portion and both ends of the supporting shaft 10 are carried in the bearings 19. At the same time, the bearings 18 extend down along the bearings 19 and both ends of the transmission shaft 11 are carried therein.

The first operating lever 6 extends from the two pivotally supporting portions of the first operating lever 6 to the two pivotally supporting portions of the second operating lever 7 along the side surfaces of the connector body 1, and the free ends of the first operating lever 6 are disposed to the outside of the pivotally supporting portions of the second operating lever 7, so that the lever 7 can be moved upward and downward on the side surfaces of the body. Furthermore, the free ends of the lever 6 each have a push-down operating portion 6a to serve as a force point. Likewise, the second operating lever 7 extends from the two pivotally supporting portions of the second operating lever 7 to the two pivotally supporting portions of the first operating lever 6 along the side surfaces of the connector body 1, and the free ends of the second operating lever 7 are disposed to the outside the two pivotally supporting portions of the first operating lever 6 so that the second operating lever 7 can be moved upward and downward on the side surfaces of the body 1. Also, the free ends of the second operating lever 7 each have a push-down operating portion 7a to serve as a force point.

The first and second operating levers 6 and 7 are disposed in such a manner as to extend along opposite side surfaces of the connector body 1, and the free ends of the first operating lever 6 are connected by a connecting plate 13 and the free ends of the second operating lever 7 are connected by the connecting plate 14. The connecting plates 13 and 14 extend along the opposite end surfaces of the connector body 1.

The first and second operating levers 6 and 7 may be connected at the end portions at which the pivotally supporting portions are located.

Next, operation of the connector of the invention will be described with reference to FIGS. 2 through 5.

Figure 2:
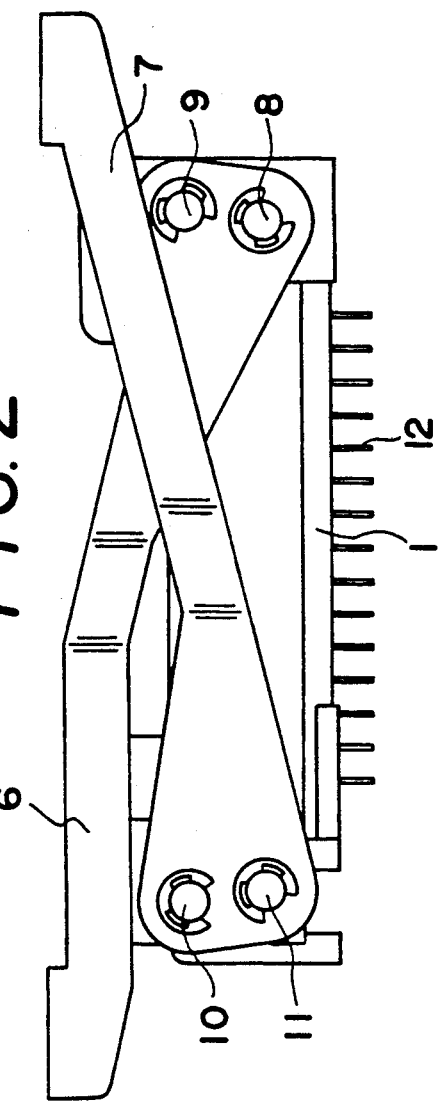
FIGS. 2 and 3 are side views thereof, FIG. 2 being a view in which first and second operating levers are already pulled upward.
Figure 3:
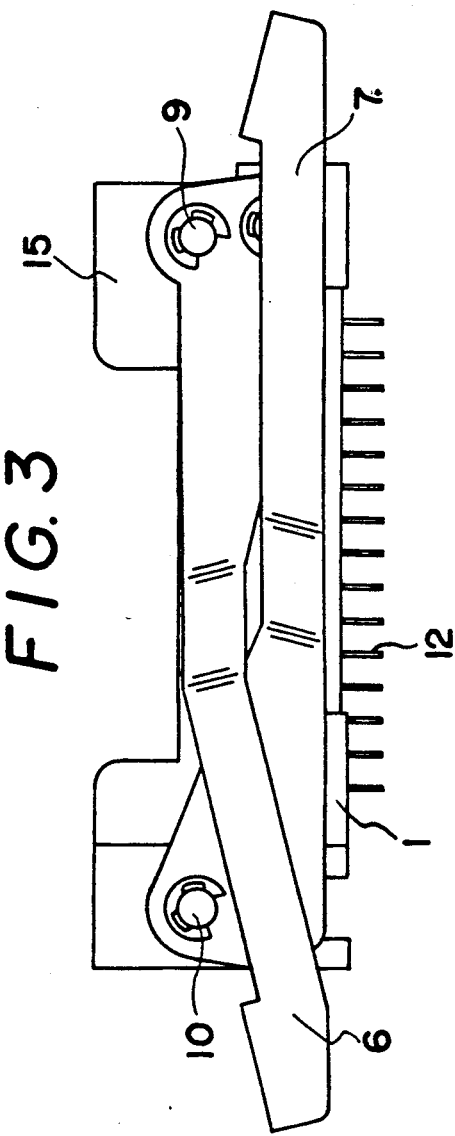

First, when the push-down operating portion 6a of the first operating lever 6 and the push-down operating portion 7a of the second operating lever 7 are simultaneously pushed down from upper positions shown in FIGS. 2 and 4A to lower positions shown in FIGS. 3 and 5A by pressure on connecting plates 13 and 14, the first operating lever 6 is pivoted counterclockwise (downward) about the supporting shaft 8. In association with the foregoing movement, the transmission shaft 9 is pivoted counterclockwise about the supporting shaft 8. The afore-mentioned pivotal movement exerts a moving force from the right to the left in the drawings on the moving plate 2. On the other hand, the second operating lever 7 is pivoted clockwise (downward) about the supporting shaft 10. In association with the pivotal movement of the second operating lever 7, the transmission shaft 11 is pivoted clockwise about the supporting shaft 10. The foregoing pivotal movement exerts a moving force from the right to the left in the drawings on the moving plate 2 the same as in the case of the transmission shaft 9. As a result, the moving plate 2 is moved in one horizontal direction.

As a result, the terminals 4 of the electric part 3 placed on the moving plate 2 are horizontally moved from the released position to the contacted position with respect to the contacts 12, and as is shown in FIG. 4B, the normally closed contacts 12 are forcedly separated by the terminals 4 while opening the contacts 12 against elasticity thereof, thereby to form a pinch-contacted state as shown in FIG. 5b.

On the other hand, when the push-down operating portion 6a of the first operating lever 6 and the push-down operating portion 7a of the second operating lever 7 are simultaneously pulled upward from lower positions shown in FIGS. 3 and 5A to upper positions shown in FIGS. 2 and 4A, the first operating lever 6 is pivoted clockwise (upward) about the supporting shaft 8. In association with the foregoing movement, the transmission shaft 9 is pivoted clockwise about the supporting shaft 8. The foregoing pivotal movement exerts a moving force from the left to the right in the drawings on the moving plate 2. Similarly, the second operating lever 7 is pivoted counterclockwise (upward) about the supporting shaft 10. In association with the foregoing movement, the transmission shaft 11 is pivoted counterclockwise about the supporting shaft 10. The foregoing pivotal movement exerts a moving force from the left to the right in the drawings on the moving plate 2 the same as in the case with the transmission shaft 9. As a result, the moving plate 2 is horizontally moved in the other direction.

As a result, the terminals 4 of the electric part 3 placed on the moving plate 2 are horizontally moved from a contacted position with respect to the contacts 12 to a released position shown in FIG. 4A. As a result, the terminals 4 are brought out of engagement with the contacts 12 as shown in FIG. 4B.

The operation of the second embodiment will be described with respect to FIGS. 6 through 8. As is shown in FIGS. 6A and 6B, the electric part 3 is placed on the moving plate 2 and the terminals 4 are thrust into the terminal insertion holes 5 formed in the moving plate 2, where the leading ends of the terminals 4 rest on the top of the contacts 12 as shown in FIG. 6B. In the foregoing state, when the push-down operating portion 6a of the first operating plate 6 and the push-down operating portion 7a of the second operating lever 7 are simultaneously pushed down from upper positions shown in FIG. 6A to lower positions shown in FIG. 7A by pressure on connecting plates 13 and 14, the moving plate 2 is horizontally moved from the right to the left in the drawings. In association with the foregoing movement, as is shown in FIG. 7B, one contact element 12a of each normally closed contact 12 engaged with a contact engaging portion 20 provided at an inner surface of the corresponding terminal insertion hole 5 of the moving plate 2 is opened against its own elasticity by the leftward movement of terminals 4 and the terminals 4 of the electric part 3 are guided between elements 12a and 12 of the contacts in order to place them in a loosely inserted state as shown in FIG. 7B.

When the push-down forces on the first and second operating levers 6 and 7 are released, the contact element 12a of each contact 12, as shown in FIGS. 8A and 8B, is moved back in the closing direction to elastically pinch the terminal 4 and at the same time, the restoring force of the contact element 12a is exerted on the engaging portion 20 of the moving plate 2 to automatically horizontally move the moving plate from the left to the right in the drawings.

The moving force (restoring force) on the moving plate 2 is exerted on the transmission shafts 9 and 11. As a result, the first and second operating levers 6 and 7 are automatically returned from the lower position to an intermediate position along the end surfaces of the connector body 1, thereby to be in a push-down waiting state.

As described in the foregoing, according to the present invention, by simultaneously pushing down or pulling upward the first and second operating levers, lateral force directed in the same direction is exerted on the one and the other ends of the moving plate in order to reduce the operating force exerted by the respective operating levers to half the necessary force, and the operating force exerted on the connector body can be divided between both end portions of the connector body. As a result, while avoiding a stress concentration on the connector body and the wiring board supporting thereof, the moving plate can be smoothly and stably moved rightward or leftward with a reduced force on the respective ends of the body, thereby to achieve a proper and sure contacted state and released state of the contacts and terminals.

Also, according to the present invention, problems inherent in the prior art due to using a crank lever as means for operating the movement of the moving plate such as twist of the crank shaft portion, irregularity of the distance of movement, and inferior contact can be effectively solved. Furthermore, a sufficient distance of movement can be obtained by a small push-down force, and a contacted position and released position can be properly obtained.

Moreover, the first and second operating levers are disposed long along the side surfaces of the connector body and are subjected to push-down operation or pull-up operation without jeopardizing the attaching and removing operation of the electric part. As the contacted state and released state can be achieved simply by means of the push-down or pull-up operation of the operating levers, this can be suitably used for automation using a robot, etc.

In addition, according to the present invention, according to conditions of use, either the first or the second operating lever may be selectively used to effect the horizontal movement of the moving plate by a pushing down operation or pull-up operation of such selected operation lever.

What is claimed is:

1. A connector for an electric part, comprising:
a connector body having a plurality of contacts for being contacted by terminals on an electric part and having a substantially flat surface;
a moving plate movably mounted on said connector body and able to move in opposite lateral directions along said surface, said moving plate being adapted to carry an electric part having terminals which are moved laterally to contact said contacts of said connector body when said moving plate is moved in one lateral direction and which are moved laterally to be moved out of contact with said contacts of said connector body when said moving plate is moved in the opposite lateral direction; and
first and second operating levers pivotally mounted on said connector body and pivotally connected to said moving plate for moving said moving plate in opposite lateral directions, said first operating lever having one end pivotably supported on a side surface of one end of said connector body on a supporting shaft and said second operating lever having one end pivotably supported on a side surface of the other end of said connector body on a supporting shaft, and said one end of said first operating lever being pivotally connected to a side surface of one end of said moving plate, corresponding to said one end of said connector body, on a transmission shaft and said one end of said second lever being pivotally connected to a side surface of the other end of said moving plate, corresponding to said other end of said connector body, on a transmission shaft, said transmission shafts being positioned on said moving plate for, when said first and second operating levers are pivoted in opposite directions around said supporting shafts, producing a lateral force directed in the same direction along said surface on said connector body on the respective ends of said moving plate.

2. A connector as claimed in claim 1 in which said supporting shafts and said transmission shafts are spaced in a direction transverse to the plane of said surface of said connector body, and the supporting shaft for the first operating lever is spaced in a first transverse position relative to said surface and the transmission shaft for the first operating lever is in a second position relative to said surface, and the supporting shaft for the second operating lever is spaced in a second transverse position relative to said surface and corresponding to the second position for the transmission shaft for the first operating lever, and the transmission shaft for the second operating lever is in a first transverse position relative to said surface and corresponding to the first transverse position for the supporting shaft for the first operating lever.

3. A connector as claimed in claim 1 in which said surface of said connector body is a horizontal surface and said supporting shafts and said transmission shafts are spaced vertically with said supporting shaft for the first operating lever being below the transmission shaft therefor and the transmission shaft for the second operating lever being below the supporting shaft therefor.

4. A connector as claimed in claim 1 in which the free ends of said operating levers extend past the end of the connector body remote from the end on which the supporting shaft therefor is mounted, and the operating levers extend along the sides of said connector body, whereby said levers can be pivoted without interfering with an electric part mounted on said moving plate.

* * * * *